United States Patent
Nakano et al.

(10) Patent No.: US 11,302,854 B2
(45) Date of Patent: Apr. 12, 2022

(54) SENSOR DEVICE

(71) Applicant: HITACHI AUTOMOTIVE SYSTEMS, LTD., Ibaraki (JP)

(72) Inventors: Hiroshi Nakano, Tokyo (JP); Masahiro Matsumoto, Tokyo (JP); Yoshimitsu Yanagawa, Tokyo (JP); Yasuo Onose, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/505,352

(22) PCT Filed: Jul. 1, 2015

(86) PCT No.: PCT/JP2015/068933
§ 371 (c)(1),
(2) Date: Feb. 21, 2017

(87) PCT Pub. No.: WO2016/027568
PCT Pub. Date: Feb. 25, 2016

(65) Prior Publication Data
US 2017/0345987 A1    Nov. 30, 2017

(30) Foreign Application Priority Data

Aug. 22, 2014    (JP) .............................. JP2014-168968

(51) Int. Cl.
*H01L 31/00* (2006.01)
*H01L 35/14* (2006.01)
(Continued)

(52) U.S. Cl.
CPC ............ *H01L 35/14* (2013.01); *G01F 1/6845* (2013.01); *G01F 1/692* (2013.01); *G01F 1/698* (2013.01);
(Continued)

(58) Field of Classification Search
CPC .......... H01L 35/02; H01L 35/14; G01F 1/692
See application file for complete search history.

(56) References Cited

U.S. PATENT DOCUMENTS

| 4,677,850 A | 7/1987 | Miura et al. |
| 6,465,784 B1 * | 10/2002 | Kimata ..................... G01J 5/34 |
| | | 250/332 |

(Continued)

FOREIGN PATENT DOCUMENTS

| EP | 1643219 A2 | 4/2006 |
| JP | 1990-219286 A | 8/1990 |

(Continued)

OTHER PUBLICATIONS

International Search Report for WO 2016/027568 A1 with Translation of Written Opinion of the International Search Authority, dated Aug. 11, 2015.

(Continued)

*Primary Examiner* — Meiya Li
(74) *Attorney, Agent, or Firm* — Volpe Koenig

(57) ABSTRACT

The purpose of the present invention is to provide a highly accurate and highly reliable physical quantity sensor wherein an error due to stress applied to a sensor element of the physical quantity sensor is reduced. This physical quantity sensor device is provided with: a hollow section formed in a Si substrate; an insulating film covering the hollow section; and a heating section formed in the insulating film. The sensor device is also provided with a detection element that detects the temperature of the insulating film above the hollow section, the detection element is provided with a first silicon element and a second silicon element, and the first silicon element and the second silicon element are doped with different impurities, respectively.

10 Claims, 5 Drawing Sheets

(51) Int. Cl.
*G01F 1/684* (2006.01)
*G01F 15/02* (2006.01)
*G01F 1/692* (2006.01)
*G01F 15/00* (2006.01)
*G01F 1/698* (2006.01)
*H01L 35/02* (2006.01)

(52) U.S. Cl.
CPC .......... *G01F 15/006* (2013.01); *G01F 15/022* (2013.01); *H01L 35/02* (2013.01)

(56) References Cited

U.S. PATENT DOCUMENTS

| 8,552,380 | B1 * | 10/2013 | Florin | G01J 5/12 |
| | | | | 250/338.4 |
| 2011/0023597 | A1 * | 2/2011 | Nakano | G01F 1/6845 |
| | | | | 73/204.25 |

FOREIGN PATENT DOCUMENTS

| JP | 1991-196582 A | 8/1991 |
| JP | 2000-321108 A | 11/2000 |
| WO | 1998/050763 A1 | 11/1998 |

OTHER PUBLICATIONS

Extended European Search Report dated Mar. 14, 2018 for the European Patent Application No. 15833857.4.
Communication pursuant to Article 94(3) EPC dated Feb. 26, 2020 for European Patent Application No. 15833857.4.

* cited by examiner

SENSOR DEVICE

TECHNICAL FIELD

The present invention relates to a sensor device for detecting a physical quantity of gas, and more particularly relates to a thermal sensor device that detects temperature to detect a physical quantity.

BACKGROUND ART

In one example of such a thermal sensor device, a sensor element is manufactured on a semiconductor substrate, such as a silicon (Si) substrate, using micromachine technology. This type of sensor element can operate with high accuracy, at high response speed, and at low power consumption. Examples of the sensor element include a flow sensor for measuring an intake air flow of an internal combustion engine, a gas concentration sensor that measures the change of thermal conductivity of gas according to a radiation amount of a heater, an inclination sensor using changes of convection of gas in the vicinity of the heater, and an acceleration sensor.

These types of sensors, however, include an element such as a heat generator disposed on a thin diaphragm in order to increase sensitivity. This leads to deformation of the sensor element caused by thermal expansion or thermal contraction of the sensor element itself, or by stress caused by a packaging member, such as a packaging material or a protection member, thus affecting detection accuracy of the sensor. Therefore, it is needed to decrease measurement errors or variations in characteristics attributable to the change of characteristic of the sensor element caused by such stress.

One example of such sensors that have been provided in the past is a flow sensor disclosed in PTL 1. PTL 1 discloses a heater formed in a two-layered structure in which each heater changes its resistance value at a diaphragm film corresponding to the flow rate of fluid. The heaters are formed at positions vertically symmetrical with each other about a center in the thickness direction of the diaphragm film, and then connected in series. Thus, a resistance change attributable to the temperature characteristic of resistance of the heaters can be taken out at high accuracy if the diaphragm film is warped due to thermal deformation or bent by external pressure.

CITATION LIST

Patent Literature

PTL 1: JP 2000-321108 A

SUMMARY OF INVENTION

Technical Problem

The past technique has achieved an effect on the warp deformation of the diaphragm by forming the individual heaters of the two-layered structure at the positions vertically symmetrical with each other about the center in the thickness direction of the diaphragm. This structure, however, is not sufficient to respond to an elongating stress or shearing stress. In the thermal sensor device, in particular, it is desired to decrease the thickness of the diaphragm as much as possible in order to increase a heat insulating characteristic. It is also desired to produce the diaphragm in advance in such a manner that the diaphragm acts as a tensile stress to decrease the warp of the thin diaphragm. Thus, the deformation of the diaphragm is mainly caused by the elongating stress or the shearing deformation rather than the warp deformation.

It is an object of the present invention to provide a highly accurate and highly reliable physical quantity sensor capable of decreasing an error caused by stress acting on a sensor element of the physical quantity sensor.

Solution to Problem

To achieve the above object, a sensor device according to an embodiment of the present invention includes a detecting element that detects a temperature of an insulating film provided over a cavity, and the detecting element includes a plurality of silicon elements each doped with a different impurity.

Advantageous Effects of Invention

According to an embodiment of the present invention, a highly accurate and highly reliable physical quantity sensor with an effect of stress acting on a sensor element of the physical quantity sensor is decreased.

DESCRIPTION OF EMBODIMENTS

Embodiments of the present invention will be described below.

First Embodiment

Referring to FIGS. 1 to 6, a first embodiment of a sensor device according to the present invention is described. In the present embodiment, a thermal air flow sensor is described as an example sensor device according to the embodiment of the present invention.

Figure 1:
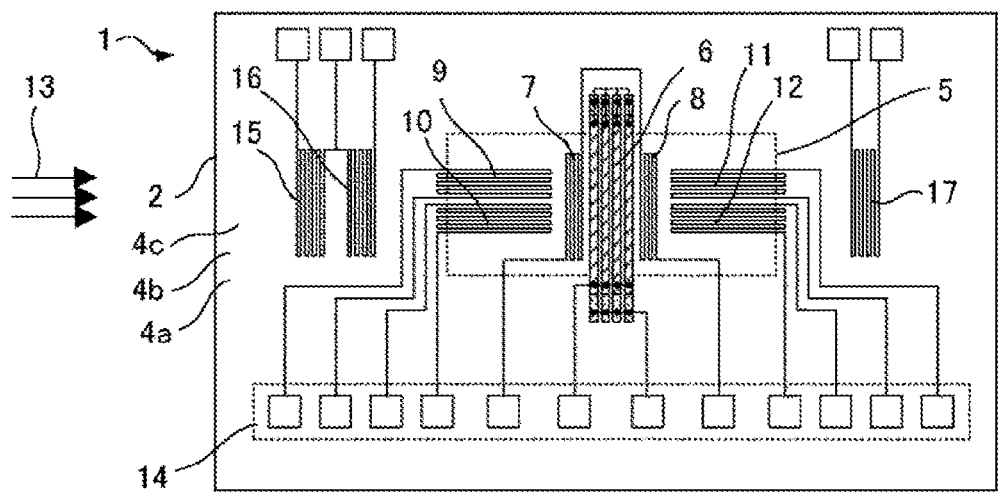
FIG. 1 is a plan view of a sensor element of a sensor device according to an embodiment of the present invention.

FIG. 1 is a plan view of a sensor element of a thermal air flow sensor of the present embodiment. A sensor element 1 of the present embodiment includes a substrate 2 made of single crystal silicon. The substrate 2 has a cavity 3 formed therein. The cavity 3 is covered by a support film which is formed of insulating films 4*a*, 4*b*, and 4*c* acting as electrical insulating films to provide a diaphragm 5. A heat generator 6 is formed on the diaphragm 5. Heating temperature sensors 7 and 8 are formed on both sides of and in the vicinity of the heat generator 6 on the diaphragm 5. On the diaphragm 5, upstream side temperature sensors 9 and 10 are formed on the upstream side of the heat generator 6, while downstream side temperature sensors 11 and 12 are formed on the downstream side of the heat generator 6. Resistors 15 to 17 for detecting a temperature of air are formed outside the diaphragm 5. Electrodes are taken out from the heat generator 6, the temperature sensors 7 to 12, and the resistors 15 to 17 by, for example, aluminum wiring, connected to a pad unit 14, and further connected electrically from the pad unit 14 to a driving and detecting circuit (not illustrated) with bonding wires.

The heat generator 6 generates heat when electric current flows, and heats the diaphragm 5 that is exposed to fluid. The heating temperature sensors 7 and 8 can detect temperatures in the vicinity of the heat generator 6, and use the temperatures in controlling the heating temperature of the heat generator 6 and performing correction according to the detected temperature values of the heat generator 6. The upstream side temperature sensors 9 and 10 detect temperatures on the upstream side of the heat generator 6. The downstream side temperature sensors 11 and 12 detect temperatures on the downstream side of the heat generator 6. The upstream side temperature sensors 9 and 10 are cooled when air flow 13 is provided, as illustrated in FIG. 1. The air passes the heat generator 6 to increase the temperature of air flowing through the downstream side of the heat generator 6, raising the temperatures of the downstream side temperature sensors 11 and 12. Thus, a temperature difference is generated between the upstream side temperature sensors 9 and 10 and the downstream side temperature sensors 11 and 12 when the air flow is provided. By detecting the temperature difference, a signal corresponding to the air flow is obtained.

Figure 2:
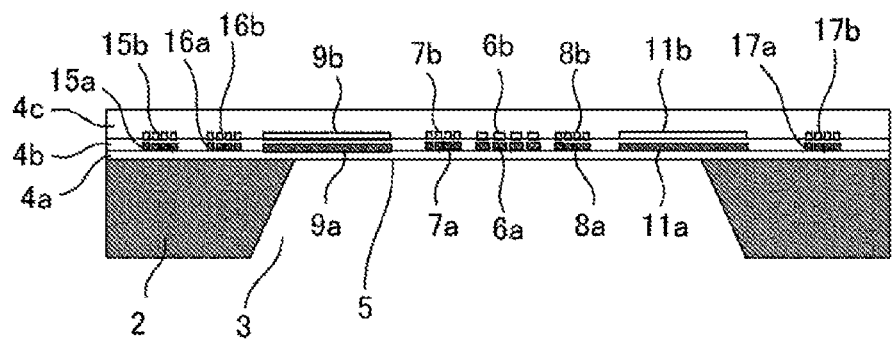
FIG. 2 is a cross-sectional view of FIG. 1.

FIG. 2 is a cross-sectional view of the sensor element of a gas sensor device according to the present embodiment. The sensor element 1 includes the substrate 2 made of single crystal silicon. The insulating film 4*a* is formed on the substrate 2. A silicon oxide film is used as a material of the insulating film 4*a*. Other materials, such as a silicon nitride film or a composite film made of these films, may also be used. On the insulating film 4*a*, a heat generator 6*a*, heating temperature sensors 7*a*, 8*a*, an upstream side temperature sensor 9*a*, a downstream side temperature sensor 11*a*, and thermosensitive resistors 15*a*, 16*a* and 17*a* are formed by patterning a first polycrystal silicon film. The first polycrystal silicon film is formed by, for example, Chemical Vapor Deposition (CVD), and doped with an impurity. Boron is used as the impurity to provide a P-type semiconductor. The insulating film 4*b* is formed on the first polycrystal silicon. The insulating film 4*b* is made of an electrically insulating material, such as a silicon oxide film. On the insulating film 4*b*, a heat generator 6*b*, heating temperature sensors 7*b*, 8*b*, an upstream side temperature sensor 9*b*, a downstream side temperature sensor 11*b*, and thermosensitive resistors 15*b*, 16*b*, 17*b* are formed by patterning a second polycrystal silicon film. The second polycrystal silicon film is formed by, for example, CVD, and doped with an impurity. Phosphorous is used as the impurity to provide an N-type semiconductor. The insulating film 4*c* is formed on the second polycrystal silicon film. The insulating film 4*c* is made of an electrically insulating material, such as a silicon oxide film. Other materials, such as a silicon nitride film or a composite film made of these films, may also be used.

Although the first polycrystal silicon film is doped with boron in the present embodiment, a trivalent element, such as aluminum, may be used to provide the P-type semiconductor. The second polycrystal silicon film is doped with phosphorous, but may also be doped with a pentavalent element, such as arsenic, to provide the N-type semiconductor. Meanwhile, the first polycrystal silicon film is the P-type semiconductor and the second polycrystal silicon film is the N-type semiconductor in the present embodiment. Inversely, the first polycrystal silicon film may be the N-type semiconductor and the second polycrystal silicon film may be the P-type semiconductor. In other words, at least two-layered polycrystal silicon doped with different impurities need to be used.

The heat generator 6 is formed as a single unit heat generator 6 in which the heat generators 6*a* and 6*b* are connected in series or in parallel with each other by a wiring layer of metal, such as aluminum. Similarly, the heating temperature sensor 7 is formed as a single unit heating temperature sensor 7 in which the heating temperature sensors 7*a* and 7*b* are connected in series or in parallel with each other. Similarly, the heating temperature sensor 8 is formed by heating temperature sensors 8*a* and 8*b*. The upstream side temperature sensor 9 is formed by the upstream side temperature sensors 9*a* and 9*b*. The downstream side temperature sensor 11 is formed by the upstream side temperature sensors 11*a* and 11*b*. The thermosensitive resistors 15, 16, and 17 are also formed in a similar structure.

Thus, the heat generators and the temperature sensors, which are disposed on the diaphragm and in which the resistance values fluctuate according to the temperature on the diaphragm, are made of a composite material of the first and second polycrystal silicon films doped with different impurities. Further, it would be more effective if the patterned first and second polycrystal silicon may be disposed on top of each other via an electrical insulating film.

Figure 3:
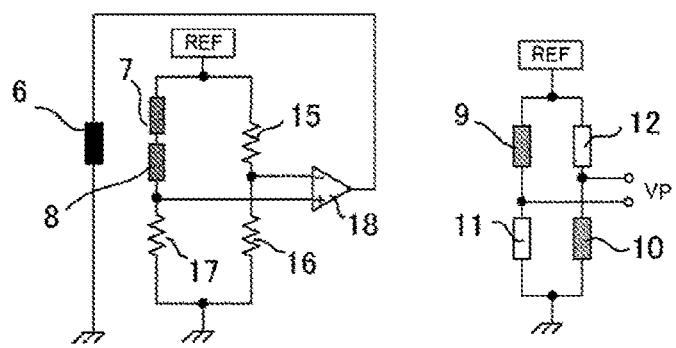
FIG. 3 is a circuit diagram illustrating an example driving and detecting circuit of a sensor element.
Figure 4:
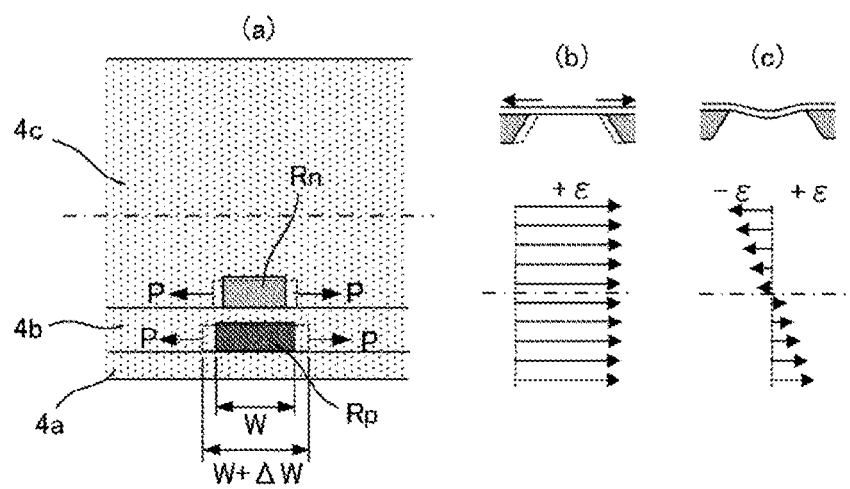
FIGS. 4(*a*) to 4(*c*) are an enlarged cross-sectional view of the sensor element of FIG. 2 and schematic views of deformation caused by distortion.

Next, a driving and detecting circuit of the sensor element 1 is described. FIG. 3 illustrates the driving and detecting circuit of the sensor element 1. A series circuit consisting of the heating temperature sensors 7 and 8 and the thermosensitive resistor 17 and a series circuit consisting of the thermosensitive resistors 15 and 16 are connected in parallel to form a bridge circuit. An intermediate voltage of each series circuit of the bridge circuit is taken out and connected to an amplifier 18. The amplifier 18 has its output connected to the heat generating resistor 6. A reference voltage (REF) is supplied to the bridge circuit. By properly setting a resistance balance between the heating temperature sensors 7 and 8, in which the resistance values change over the temperature of the heat generator 6, and the thermosensitive resistors 15 to 17, in which the resistance values change over the temperature of air, the heat generator 6 can be controlled such that the heat generator 6 is heated by a predetermined temperature relative to the temperature of air Ta.

Although the amplifier 18 is used in the present embodiment as a temperature control circuit of the heat generator 6, it is at least needed to detect a voltage difference of the bridge circuit and supply an electric current corresponding to the detected voltage difference to the heat generator 6. For example, the voltage difference of the bridge circuit may be converted to a digital signal by an A-D converter, followed by D-A conversion based on the converted digital signal, to control the heating current of the heat generator 6.

The detecting circuit of the flow rate is formed by the bridge circuit in which the series circuit consisting of the upstream side temperature sensor 9 and the downstream side temperature sensor 11 and the series circuit consisting of the downstream side temperature sensor 12 and the upstream side temperature sensor 10 are connected in series. The reference voltage (REF) is applied to the bridge circuit. When the temperature difference occurs between the upstream side temperature sensors 9 and 10 and the downstream side temperature sensors 11 and 12 by the air flow 13, the resistance balance of the bridge circuit changes and generates a voltage difference. This voltage difference is detected, and an output corresponding to the air flow rate is obtained.

The sensor element 1 of the present invention achieves an effect described below. FIG. 4(a) is an enlarged cross-sectional view of an element Rp formed by patterning the first polycrystal silicon film and an element Rn formed by patterning the second polycrystal silicon film. The element Rn is formed on the element Rp via the insulating film 4b. When the diaphragm expands, as illustrated in FIG. 4(b), by the deformation of the sensor element, and generates distortion in the element Rp and the element Rn, a line width W changes to W+ΔW and distortion ε=ΔW/W occurs. When the element Rp changes due to the distortion ε, the resistance value Rp of the element Rp is ΔRp/Rp=Gp×ε. Gp represents a gauge factor of the element Rp. Since the element Rp and the element Rn are disposed closely with each other via the thin insulating film, the distortion ε similarly occurs in the element Rn and the resistance change occurs as ΔRn/Rn=Gn×ε.

Figure 5:
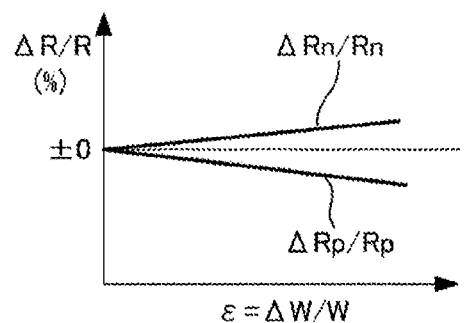
FIG. 5 illustrates resistance change caused by distortion.

The Rp is the P-type semiconductor, such that the gauge factor Gp is a negative value when the above-described distortion occurs in a direction crossing the direction of the electric current flowing through the above-described element (Gp=−17 to −12). In addition, the element Rn is the N-type semiconductor, such that the gauge factor Gn is a positive value when the above-described distortion occurs (Gn=+10 to +15). Gp and Gn values change according to doping concentrations of the impurities, but have equal absolute values with signs inverted from each other. Thus, as illustrated in FIG. 5, the resistance changes negatively when the distortion is generated in the element Rp, while the resistance changes positively when the distortion is generated in the element Rn.

Figure 6:
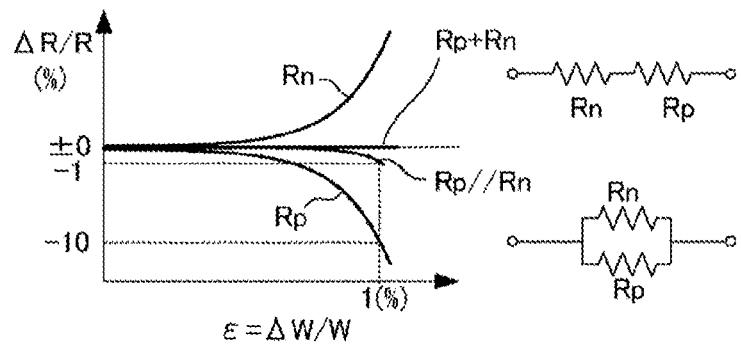
FIG. 6 illustrates resistance change caused by distortion.

FIG. 6 illustrates the resistance change when the elements Rp and Rn are used as a composite element. When the elements Rp and Rn are connected in series and the resistance value is Rp+Rn, the resistance changes of Rp and Rn can offset each other. The series connection is very effective composite structure, as being able to respond to various distortions ranging from very small deformations to large deformations. The offsetting effect of the resistance values can also be achieved when the elements Rp and Rn are connected in parallel and the resistance value is Rp//Rn=1/(1/Rp+1/Rn). Even the parallel connection can achieve the effect of decreasing the resistance change to 1/10 if the distortion ε occurs in a small distortion area occupying about 1%.

When the distortion causes expansion of the diaphragm, as illustrated in FIG. 4(b), a uniform distortion is applied in the thickness direction of the diaphragm. When the warp deformation occurs in the diaphragm, as illustrated in FIG. 4(c), negative distortions occur on the upper layer side and positive distortions occur on the lower layer side about the center of the diaphragm in the thickness direction. It is therefore desirable to dispose both elements Rp and Rn on one side of the diaphragm from the center of the diaphragm in the thickness direction in order to achieve the effect on the warp deformation of the diaphragm. This allows both elements Rp and Rn to provide the distortion in the same direction. Meanwhile, as illustrated in FIG. 4(c), the absolute values of the distortions are different according to the thickness direction of the diaphragm. It is desired, therefore, to dispose the elements Rp and Rn close to each other in the thickness direction of the diaphragm. This allows the absolute values of the distortions of the elements Rp and Rn to be close each other. Such an arrangement can effectively offset the resistance change between the elements Rp and Rn.

In the present embodiment, as illustrated in FIG. 2, all components formed on the sensor element 1, that is, the heat generator 6, the heating temperature sensors 7 and 8, the upstream side temperature sensors 9 and 10, the downstream side temperature sensors 11 and 12, and the resistors 15 to 17, are formed of the elements made of a composite material of the first and second polycrystal silicon. Alternatively, one of those elements would be made of a composite material to achieve a similar effect. It would be more effective if the composite material is used in the element disposed on a portion having a particularly large deformation on the diaphragm. It is desired that the heating temperature sensors 7 and 8 and the resistors 15 to 17, both being incorporated in the bridge circuit, have the same characteristic. When the heating temperature sensors 7 and 8 are made of the composite material, the resistors 15 to 17 are made of the same material with the same line width to provide the matching temperature coefficient of resistance. This decreases fluctuations of the bridge balance over the temperature change and achieves highly accurate heating temperature control.

In the present embodiment, as illustrated in FIG. 4(a), the P-type first polycrystal silicon element Rp is configured to have a larger width than the width of the N-type second polycrystal silicon element Rn. This allows the element Rn to be formed on a planar portion of the element Rp, eliminating a concern of a clack or decrease of reliability caused by unevenness. Meanwhile, the P-type element Rp has a larger gauge factor than the N-type element Rn. The resistance change of the element Rp, therefore, is larger when the same distortion is applied. When the line width of the element Rp is wider than the line width of the element Rn, as illustrated in FIG. 4(a), a small resistance value can be set for the element Rp. This decreases the resistance change due to the distortion and prevents the decrease of the offsetting effect due to the difference in gauge factor between the N-type element and the P-type element.

Second Embodiment

A second embodiment of the sensor device according to the present invention is described below by referring to FIGS. 7 to 9. In the present embodiment, a thermal air flow sensor is described as an example sensor device according to the embodiment of the present invention. In the present embodiment, a part of the structure that differs from the structure of the first embodiment is mainly described in detail.

Figure 7:
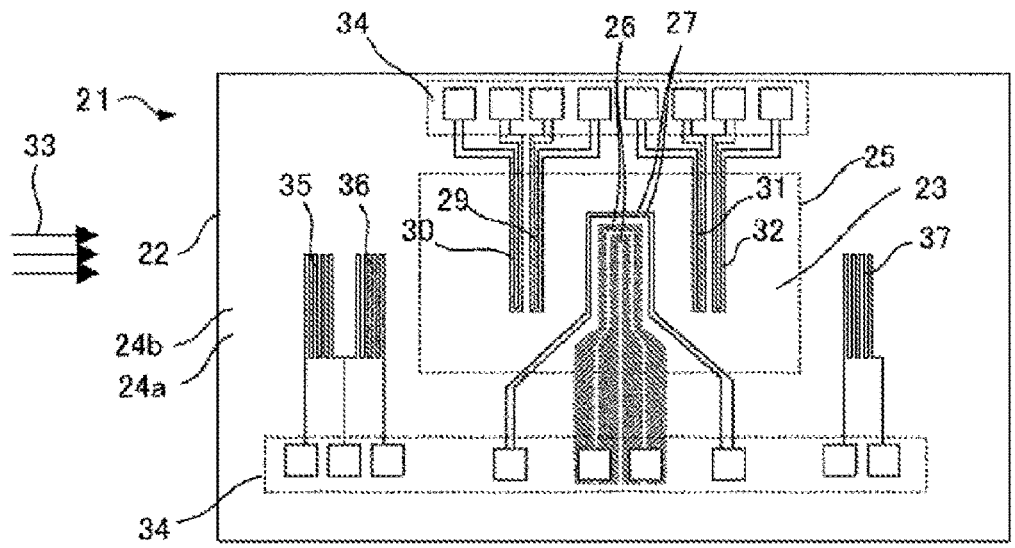
FIG. 7 is a plan view of a sensor element of a sensor device according to an embodiment of the present invention.

FIG. 7 is a plan view of a sensor element 21 of a thermal air flow sensor according to the present embodiment. The sensor element 21 of the present embodiment includes a substrate 22 made of single crystal silicon. The substrate 22 includes a cavity 23 which is covered by support films formed of insulating films 24a, 24b to provide a diaphragm 25. A heat generator 26 is formed on the diaphragm 25. A heating temperature sensor 27 is formed on the diaphragm 25 so as to surround the heat generator 26. On the diaphragm 25, upstream side temperature sensors 29 and 30 are formed on the upstream side of the heat generator 26, while downstream side temperature sensors 31, 32 are formed on the downstream side of the heat generator 26. Resistors 35 to 37 for detecting a temperature of air are formed outside the diaphragm 25. Electrodes are taken out from those elements by, for example, aluminum wiring, connected to a pad unit 34, and further connected from the pad unit 34 to the driving and detecting circuit (not illustrated) with bonding wires.

The heat generator 26 generates heat when electric current flows, and heats the diaphragm 25 that is exposed to fluid. The heating temperature sensor 27 can detect temperatures in the vicinity of the heat generator 26, and use the temperatures in controlling the heating temperature of the heat generator 26 and performing correction according to the detected temperature values of the heat generator 26. The upstream side temperature sensors 29 and 30 detect temperatures on the upstream side of the heat generator 26. The downstream side temperature sensors 31, 32 detect temperatures on the downstream side of the heat generator 26. The upstream side temperature sensors 29 and 30 are cooled when air flow 33 is provided, as illustrated in FIG. 7. The air passes the heat generator 26 to increase the temperature of air flowing through the downstream side of the heat generator 26, raising the temperatures of the downstream side temperature sensors 31, 32. Thus, a temperature difference is generated between the upstream side temperature sensors 29 and 30 and the downstream side temperature sensors 31, 32 when the air flow is provided. By detecting the temperature difference, a signal corresponding to the air flow is obtained.

Figure 8:
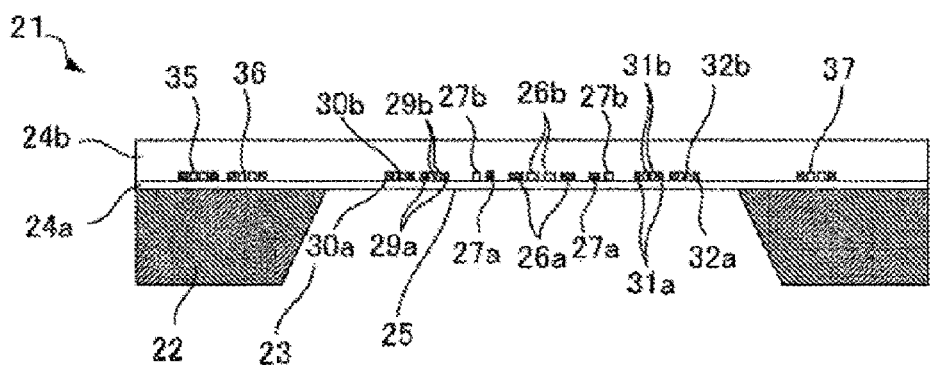
FIG. 8 is a cross-sectional view of FIG. 7.
Figure 9:
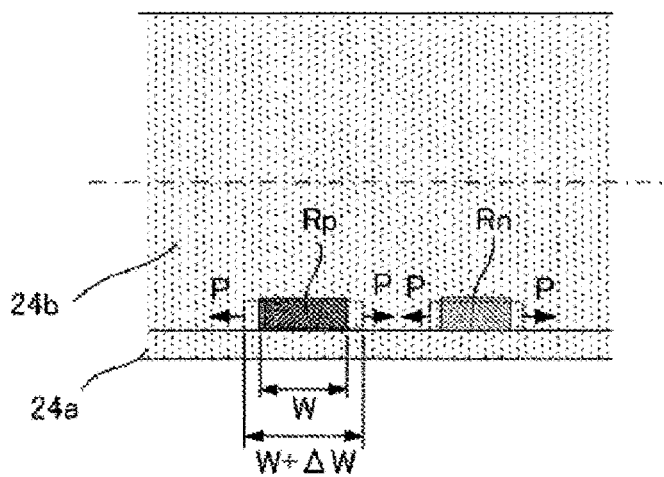
FIG. 9 is an enlarged cross-sectional view of FIG. 7.

FIG. 8 is a cross-sectional view of the sensor element 21 according to the present embodiment. The sensor element 21 includes a substrate 22 made of single crystal silicon. An insulating film 24a is formed on the substrate 22. A silicon oxide film is used as a material of the insulating film 24a. On the insulating film 24a, heat generators 26a, 26b, heating temperature sensors 27a, 27b, upstream side temperature sensors 29a, 29b, downstream side temperature sensors 31a, 31b, and thermosensitive resistors 35, 36 and 37 are formed by patterning the single crystal silicon layer. In the present embodiment, an SOI substrate can be used as a base material of the substrate 22, the insulating film 24a, and the single crystal silicon layer. The single crystal silicon layer is doped with impurities, followed by patterning by etching, to form elements, such as the heat generators 26a, 26b, the heating temperature sensors 27a, 27b, the upstream side temperature sensors 29a, 29b, the downstream side temperature sensors 31a, 31b, and the thermosensitive resistors 35 to 37. The single crystal silicon layer includes impurities of the P-type region doped with boron and the N-type region doped with phosphorous. The heat generator 26 includes the heat generator 26a doped with boron and the heat generator 26b doped with phosphorous. The heating temperature sensor 27 is formed of the resistors of the heating temperature sensor 27a doped with boron and the heating temperature sensor 27b doped with phosphorous. The upstream side temperature sensor 29 is formed of the resistors of the upstream side temperature sensor 29a doped with boron and the upstream side temperature sensor 29b doped with phosphorous. The same thing can be applied to the upstream side temperature sensor 30a and 30b and the downstream side temperature sensor 32a and 32b.

The P-type single crystal silicon layer is doped with boron in the above-described structure, but may also be doped with a trivalent element, such as aluminum. The N-type single crystal silicon film is doped with phosphorous, but may also be doped with a pentavalent element, such as arsenic. Further, the P-type element and the N-type element are formed in a layout illustrated in FIG. 8, but the elements on the sensor element 21 are at least made of a plurality of single crystal silicon doped with different impurities.

The heat generator 26 is formed as a single unit heat generator 26 in which the heat generators 26a and 26b are connected in series or in parallel. The heating temperature sensor 27 is formed as a single unit heating temperature sensor 27 in which the heating temperature sensors 27a and 27b are connected in series or in parallel. Similarly, the upstream side temperature sensor 29 is formed of upstream side temperature sensors 29a and 29b. The downstream side temperature sensor 31 is formed of the downstream side temperature sensors 31a and 31b. The thermosensitive resistors 35, 36 and 37 are formed in a similar manner.

The heat generators and the temperature sensors in which the resistance values fluctuate according to the temperature on the diaphragm 25 are made of the composite material in which single-layered single crystal silicon layers are doped with different impurities. Further, it would be more effective if the patterned P-type single crystal silicon element and the N-type single crystal silicon element may be disposed side by side. This allows the P-type element and the N-type element to be disposed approximately in the same position and allows equal distortion to be applied to those elements.

An effect of the sensor element 21 of the present embodiment is described below. FIG. 9 is an enlarged cross-sectional view of the elements Rp and Rn that are formed by patterning the single crystal silicon films each doped with a different impurity on the sensor element 21. The element Rp is the P-type single crystal silicon, while the element Rn is the N-type single crystal silicon. The elements Rp and Rn are formed in the same layer and disposed side by side. When distortion occurs in the elements Rp and Rn due to the deformation of the sensor element, the line width W changes to W+ΔW and the distortion ε=ΔW/W occurs. When the element Rp changes due to the distortion E, the resistance value Rp of the element Rp is ΔRp/Rp=Gp×ε. Gp represents a gauge factor of the element Rp. Since the element Rp and the element Rn are disposed closely with each other side by side, the distortion E similarly occurs in the element Rn and the resistance change occurs as ΔRn/Rn=Gn×ε.

The Rp is the P-type single crystal silicon, such that the gauge factor Gp is a positive value when the above-described distortion occurs. In addition, the element Rn is the N-type single crystal silicon, such that the gauge factor Gn is a negative value when the above distortion occurs. Gp and Gn values change according to doping concentrations or crystal direction of the impurities, but their absolute values are equal with signs inverted. The elements Rp and Rn have different increasing and decreasing directions of the resistance change as in the first embodiment. When such elements are connected in series and in parallel to provide a combined resistance, the resistance change is mutually offset, allowing the decrease of influence of the distortion.

In the present embodiment, as illustrated in FIG. 8, all components formed on the sensor element 21, that is, the heat generator 26, the heating temperature sensor 27, the upstream side temperature sensors 29 and 30, the downstream side temperature sensors 31, 32, and the resistors 35 to 37, are formed of the elements made of a composite material of the P-type single crystal silicon and the N-type single crystal silicon. Alternatively, one of those elements would be made of a composite material to achieve a similar effect. In this case, it would be more effective if the composite material is used in the element disposed on a portion having a particularly large deformation on the diaphragm. It is desired that the heating temperature sensor 27 and the resistors 35 to 37, both being incorporated in the bridge circuit, are the resistors having the same characteristic. When the heating temperature sensor 27 is made of the composite material, the resistors 35 to 37 can be made of the same material with the same line width to provide the matching temperature coefficient of resistance. This decreases fluctuations of the bridge balance over the temperature change and achieves a highly accurate heating temperature control.

In the present embodiment, the P-type element and the N-type element are formed by doping different impurities to different regions of the single crystal silicon. The gauge factor changes more largely depending on the direction of stress applied to the single crystal silicon when compared to the polycrystal silicon. Further, directional dependency is different between the P-type and the N-type. If the P-type element and the N-type element are patterned in the same shape and direction, a different amount of resistance change would be provided if the same stress is applied. However, the distortion on the diaphragm receives stress in various directions. By combining the elements having gauge factors of opposite signs, the effect of decreasing the resistance change caused by distortion can be achieved. It would be more effective to properly set the optimal shape according to the direction of the main stress and the patterning direction and the line width of the elements.

Third Embodiment

A third embodiment of the sensor device according to the present invention will be described below by referring to FIGS. 10 to 12. In the present embodiment, a thermal air flow sensor is described as an example sensor device according to the embodiment of the present invention. In the present embodiment, a part of the structure that differs from the structure of the first embodiment is mainly described in detail.

Figure 10:
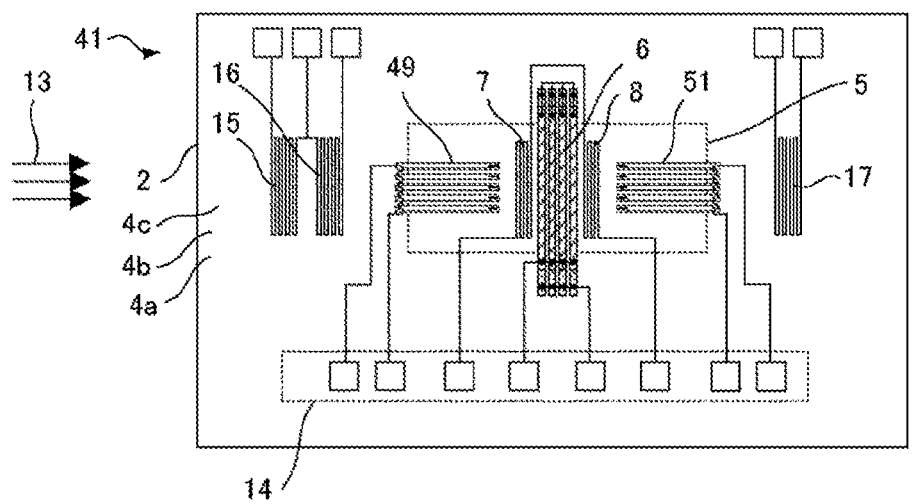
FIG. 10 is a plan view of a sensor element of a sensor device according to an embodiment of the present invention.

FIG. 10 is a plan view of a sensor element 41 of a thermal air flow sensor according to the present embodiment. In the present embodiment, an upstream side temperature sensor 49 and a downstream side temperature sensor 51 are different from those of the first embodiment. The first embodiment is the temperature detecting method using the resistance change by temperature of the polycrystal silicon. In contrast, the upstream side temperature sensor 49 and the downstream side temperature sensor 51 of the present embodiment detect temperature by thermocouple using a thermoelectric effect of the polycrystal silicon. Other components of the structure of the sensor element 41 are the same as those of the first embodiment.

Figure 11:
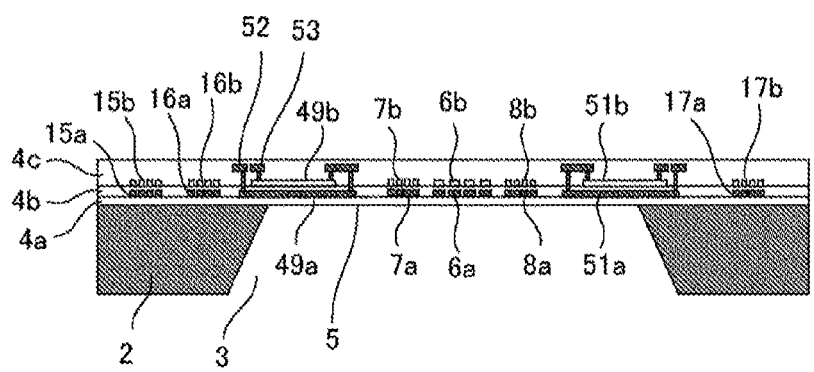
FIG. 11 is a cross-sectional view of FIG. 10.

FIG. 11 is a cross-sectional view of the sensor element 41 according to the present embodiment. The sensor element 41 includes the substrate 2 made of single crystal silicon as in the first embodiment. The insulating film 4a is formed on the substrate 2. A silicon oxide film is used as a material of the insulating film 4a. Other materials, such as a silicon nitride film or a composite film made of these films, may also be used. On the insulating film 4a, the heat generator 6a, the heating temperature sensors 7a, 8a, an upstream side temperature sensor 49a, a downstream side temperature sensor 51a, and the thermosensitive resistors 15a, 16a, 17a are formed by patterning the first polycrystal silicon film. The first polycrystal silicon film is formed by, for example, CVD, and doped with an impurity. Boron is used as the impurity to provide the P-type semiconductor. The insulating film 4b is formed on the first polycrystal silicon. The insulating film 4b is made of an electrically insulating material, such as a silicon oxide film. On the insulating film 4b, the heat generator 6b, the heating temperature sensors 7b, 8b, an upstream side temperature sensor 49b, a downstream side temperature sensor 51b, and the thermosensitive resistors 15b, 16b, 17b are formed by patterning the second polycrystal silicon film. The second polycrystal silicon film is formed by, for example, CVD, and doped with an impurity. Phosphorous is used as the impurity to provide the N-type semiconductor. The insulating film 4c is formed on the second polycrystal silicon film. The insulating film 4c is made of an electrically insulating material, such as a silicon oxide film. Other materials, such as a silicon nitride film or a composite film made of these films, may also be used.

In the present embodiment, the first polycrystal silicon film is doped with boron, but may also be doped with a trivalent element, such as aluminum. The second polycrystal silicon film is doped with phosphorous, but may also be doped with a pentavalent element, such as arsenic. Meanwhile, the first polycrystal silicon film is the P-type semiconductor and the second polycrystal silicon film is the N-type semiconductor in the present embodiment. Inversely, the first polycrystal silicon film may be the N-type semiconductor and the second polycrystal silicon film may be the P-type semiconductor. In other words, at least two-layered polycrystal silicon doped with different impurities need to be used.

The heat generator 6 is formed as a single unit heat generator 6 in which the heat generators 6a and 6b are connected in series or in parallel by a wiring layer of metal, such as aluminum. Similarly, the heating temperature sensor 7 is formed as a single unit heating temperature sensor 7 in which the heating temperature sensors 7a and 7b are connected in series or in parallel. Similarly, the heating temperature sensor 8 is formed as a single unit heating temperature sensor 8 in which the heating temperature sensors 8a and 8b are connected in series or in parallel. The upstream side temperature sensor 49 is a thermocouple formed of the upstream side temperature sensors 49a and 49b. The upstream side temperature sensor 49 is provided as a pattern extending toward the heat generator 6 from outside the diaphragm 5. The P-type polycrystal silicon layer (49a) and the N-type polycrystal silicon layer (49b) are electrically connected to form a hot junction at the end portion of the upstream side temperature sensor 49 on the heat generator 6 side. The same thing can be applied to the downstream side temperature sensor 51.

Figure 12:
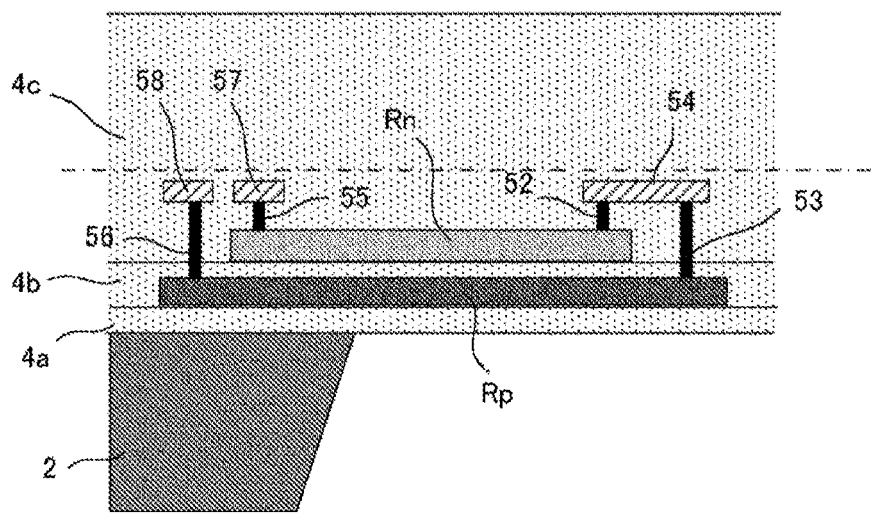
FIG. 12 is an enlarged cross-sectional view of FIG. 11.
Figure 13:
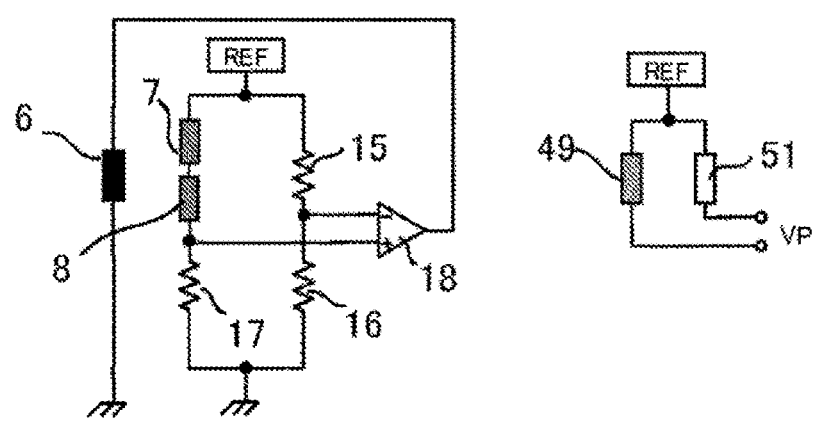
FIG. 13 is a circuit diagram illustrating an example driving and detecting circuit of a sensor element.

FIG. 12 is an enlarged cross-sectional view of the upstream side temperature sensor 49 formed as the thermocouple. The resistance Rp made of the first polycrystal silicon, which is the P-type semiconductor, and the resistance Rn made of the second polycrystal silicon, which is the N-type semiconductor, are patterned in parallel. One ends of those resistance elements are connected to the upper aluminum layer 54 via plugs 52 and 53, thus electrically connecting the resistance Rp and the resistance Rn. On the other ends of the resistance elements, the resistance element Rn is connected to the upper aluminum layer 57 via the plug 55, while the resistance element Rp is connected to the aluminum layer 58 via the plug 56. In such a thermocouple structure, a temperature difference occurring on both ends of the thermocouple generates an electromotive force, and this electromotive force is detected via the aluminum layers 57, 58 to detect temperature.

Thus, the heat generators and the temperature sensors, which are disposed on the diaphragm and in which the resistance values fluctuate according to the temperature, are made of a composite material of the first and second polycrystal silicon films doped with different impurities.

Further, it would be more effective if the patterned first and second polycrystal silicon may be disposed on top of each other. It would be better if the insulating film 4b is formed thinner than other insulating films 4a, 4b.

Next, a driving and detecting circuit of the sensor element 41 is described. FIG. 12 illustrates the driving and detecting circuit of the sensor element 41. A series circuit consisting of the heating temperature sensors 7 and 8 and the thermosensitive resistor 17 and a series circuit consisting of the thermosensitive resistors 15 and 16 are connected in parallel to form a bridge circuit. An intermediate voltage of each series circuit of the bridge circuit is taken out and connected to an amplifier 18. The amplifier 18 has its output connected to the heat generating resistor 6. A reference voltage (REF) is supplied to the bridge circuit. By properly setting a resistance balance between the heating temperature sensors 7 and 8, in which the resistance values change over the temperature of the heat generator 6, and the thermosensitive resistors 15 to 17, in which the resistance values change over the temperature of air, the heat generator 6 can be controlled such that the heat generator 6 is heated by a predetermined temperature relative to the temperature of air Ta.

Although the amplifier 15 is used in the present embodiment as a temperature control circuit of the heat generator 6, it is at least needed to detect a voltage difference of the bridge circuit and supply an electric current corresponding to the detected voltage difference to the heat generator 6. For example, the voltage difference of the bridge circuit may be converted to a digital signal by an A-D converter, followed by D-A conversion based on the converted digital signal, to control the heating current of the heat generator 6.

In the flow rate detecting circuit, one ends of the upstream side temperature sensor 49 and the downstream side temperature sensor 51 are connected to the reference voltage REF. Voltage at the other ends of the upstream side temperature sensor 49 and the downstream side temperature sensor 51 is detected to allow detection of the electromotive force corresponding to the temperature difference. Thus, the electromotive force (voltage difference) between the upstream side temperature sensor 49 and the downstream side temperature sensor 51 is detected to obtain the output corresponding to the air flow.

An effect of the sensor element 41 of the present embodiment is described.

The present embodiment uses a thermocouple as the temperature sensor. The thermocouple, in principle, utilizes occurrence of the electromotive force cause by temperature, and is less affected by the resistance change of distortion compared to using the resistance change by temperature of the first embodiment. However, the thermocouple made of a semiconductor material having a high resistivity has a large internal resistance. Voltage is generated when a minute current flows through the thermocouple, and an error is generated in the temperature value detected by the thermoelectric effect. Further, the error is also generated in measurement of the temperature when the resistance value of the polycrystal silicon changes due to the distortion and the voltage generated by the minute current fluctuates.

In the present embodiment, Rp made of the P-type polycrystal Si and Rn made of the N-type polycrystal Si are connected in series as the constituent material of the thermocouple. Thus, the resistance change of the elements Rp, Rn offset each other, as described in the first embodiment. In other words, as illustrated in FIG. 12, the resistance value does not change when seen from the aluminum layers 58, 57, decreasing the occurrence of the voltage change caused by the resistance change of distortion even when a minute current flows.

The heating temperature sensors 7 and 8 of the present embodiment use a temperature detecting method using the resistance change by temperature. Since the heating temperature sensors 7 and 8 are formed as described in the first embodiment, the resistance change caused by distortion can similarly offset each other and decrease the error of the temperature detection. Further, the fact that the temperature rises gradually toward the heat generator 6 increases the influence of degradation by heat. Since the thermocouple uses metal layers, which are aluminum layers, at the hot junction, disconnection, for example, may occur due to migration and decrease the reliability for the long-time use. As described in the present embodiment, therefore, the heating temperature sensors near the heat generator 6 are formed using the resistance change by temperature of the polycrystal silicon, while the upstream side temperature sensor and the downstream side temperature sensor, which are disposed apart from the heat generator 6, are formed as the thermocouple having high temperature detecting sensitivities. This allows the sensor element to have an improved long term reliability and flow rate detecting sensitivity.

REFERENCE SIGNS LIST 1 sensor element
2 substrate
3 cavity
4a, 4b and 4c insulating film
5 diaphragm
6 heat generator
7 and 8 heating temperature sensor
9 and 10 upstream side temperature sensor
11 and 12 downstream side temperature sensor
13 air flow
14 pad unit
15, 16 and 17 resistor
18 amplifier
21 sensor element
22 substrate
23 cavity
24 insulating film
25 diaphragm
26 heat generator
27 heating temperature sensor
29 and 30 upstream side temperature sensor
31 and 32 downstream side temperature sensor
33 air flow
34 pad unit
35, 36 and 37 thermosensitive resistor
49 upstream side temperature sensor
51 downstream side temperature sensor
52 and 53, 55 and 56 plug
54, 57 and 58 aluminum layer

The invention claimed is:
1. A sensor device that determines a flow rate of a gas in an airflow path, the sensor device comprising:
a cavity formed in a silicon (Si) substrate;
an insulating film covering the cavity;
an upstream temperature sensor formed from single crystal silicon film layers that are formed on the insulating film, wherein the upstream temperature sensor measures a first temperature of the gas in the airflow path based on a change in resistance of a first portion of the single crystal silicon film layers that comprise the upstream temperature sensor;
at least one heat generator formed on the insulating film that heats the gas in the airflow path after the upstream temperature sensor has measured the first temperature;
a downstream temperature sensor formed from the single crystal silicon film layers that are formed on the insulating film, wherein the downstream sensor measures a second temperature of the gas in the airflow path after the gas is heated by the at least one heat generator based on a change in resistance of a second portion of the single crystal silicon film layers that comprise the downstream temperature sensor; and
a detecting circuit that determines the flow rate of the gas in the airflow path based on the change of resistance in the first portion and the second portion of the single crystal silicon film layers,
wherein the single crystal silicon film layers include:
a first silicon layer that is doped with a first impurity; and
a second silicon layer that is doped with a second impurity, wherein the first impurity and the second impurity are different, and
wherein the first silicon layer and the second silicon layer are arranged close to each other so as to be adjacent to each other,
wherein the at least one heat generator includes a first heat generator and a second heat generator, and
wherein the first heat generator surrounds the second heat generator and the first heat generator is doped with the first impurity and the second heat generator is doped with the second impurity.

2. The sensor device according to claim 1, wherein the first silicon layer includes a first polycrystal silicon element, the second silicon layer includes a second polycrystal silicon element, and the first polycrystal silicon element and the second polycrystal silicon element are individually doped with different impurities.

3. The sensor device according to claim 2, wherein
the first polycrystal silicon element is a P-type semiconductor, and the second polycrystal silicon element is an N-type semiconductor.

4. The sensor device according to claim 2, wherein the first polycrystal silicon element is disposed on or under the second polycrystal silicon element via the insulating film.

5. The sensor device according to claim 1, wherein
the first silicon layer includes a P-type polycrystal silicon element doped with boron, and
the second silicon layer includes an N-type polycrystal silicon element doped with phosphorous,
the N-type polycrystal silicon element is disposed on the P-type polycrystal silicon element via the insulating film, and
the P-type polycrystal silicon element has a line width wider than that of the N-type polycrystal silicon element.

6. The sensor device according to claim 1, wherein
at least the upstream temperature sensor or the downstream temperature sensor includes:
a first single crystal silicon element formed from the first layer of the single crystal silicon film layers, and
a second single crystal silicon element formed from the second layer of the single crystal silicon film layers.

7. The sensor device according to claim 6, wherein
the first single crystal silicon element is a P-type semiconductor and the second single crystal silicon element is an N-type semiconductor.

8. The sensor device according to claim 7, wherein
the first single crystal silicon element is formed by etching the first layer of the single crystal silicon film layers, and
the second single crystal silicon element is formed by etching the second layer of the single crystal silicon film layers, and
the first single crystal silicon element and the second single crystal silicon element are disposed side by side via the insulating film.

9. The sensor device according to claim 1, further includes:
a first set of pads; and
a second set of pads,
wherein the first set of pads is opposite the second set of pads.

10. The sensor device according to claim 9, wherein
the first set of pads is connected to at least the first heat generator and the second heat generator, and
the second set of pads is connected to at least the upstream temperature sensor and the downstream temperature sensor.

* * * * *